(12) United States Patent
Bayless et al.

(10) Patent No.: US 10,770,421 B2
(45) Date of Patent: Sep. 8, 2020

(54) BOND CHUCKS HAVING INDIVIDUALLY-CONTROLLABLE REGIONS, AND ASSOCIATED SYSTEMS AND METHODS

(71) Applicant: Micron Technology, Inc., Boise, ID (US)

(72) Inventors: Andrew M. Bayless, Boise, ID (US); Cassie L. Bayless, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/236,446

(22) Filed: Dec. 29, 2018

(65) Prior Publication Data
US 2020/0212002 A1 Jul. 2, 2020

(51) Int. Cl.
*H01L 23/00* (2006.01)
*B32B 37/12* (2006.01)
*H01L 21/66* (2006.01)

(52) U.S. Cl.
CPC .............. *H01L 24/75* (2013.01); *B32B 37/12* (2013.01); *H01L 22/20* (2013.01); *H01L 24/83* (2013.01); *B32B 2037/1253* (2013.01); *B32B 2457/00* (2013.01); *H01L 2224/759* (2013.01); *H01L 2224/7555* (2013.01); *H01L 2224/75265* (2013.01); *H01L 2224/75801* (2013.01); *H01L 2224/75981* (2013.01);
(Continued)

(58) Field of Classification Search
None
See application file for complete search history.

(56) References Cited

U.S. PATENT DOCUMENTS

| | | | |
|---|---|---|---|
| 2006/0289447 A1* | 12/2006 | Mohamed | H01L 21/67248 219/444.1 |
| 2017/0221856 A1 | 8/2017 | Yamauchi | |
| 2019/0348347 A1 | 11/2019 | Mahler et al. | |

OTHER PUBLICATIONS

U.S. Appl. No. 16/236,449—Unpublished U.S. Patent Application by Andrew M. Bayless et al., titled "Bond Chucks Having Individually-Controllable Regions, and Associated Systems and Methods", filed Dec. 28, 2018, 30 pages.

* cited by examiner

*Primary Examiner* — Asok K Sarkar
(74) *Attorney, Agent, or Firm* — Perkins Coie LLP

(57) ABSTRACT

A bond chuck having individually-controllable regions, and associated systems and methods are disclosed herein. The bond chuck comprises a plurality of individual regions configured to be individually heated independent of one another. In some embodiments, the individual regions include a first region configured to be heated to a first temperature, and a second region peripheral to the first region and configured to be heated to a second temperature different than the first temperature. In some embodiments, the bond chuck further comprises (a) a first coil disposed within the first region and configured to heat the first region to the first temperature, and (b) a second coil disposed within the second region and configured to heat the second region to the second temperature. The bond chuck can be positioned proximate a substrate of a semiconductor device such that heating the first region and/or second region affect the viscosity of an adhesive used to bond substrates of the semiconductor device to one another. Accordingly, heating the first region and/or the second region can cause the adhesive on the substrate to flow in a lateral, predetermined direction.

20 Claims, 9 Drawing Sheets

(52) U.S. Cl.
CPC .............. *H01L 2224/83234* (2013.01); *H01L 2224/83908* (2013.01); *H01L 2924/3511* (2013.01)

BOND CHUCKS HAVING INDIVIDUALLY-CONTROLLABLE REGIONS, AND ASSOCIATED SYSTEMS AND METHODS

CROSS-REFERENCE TO RELATED APPLICATION

This application contains subject matter related to a concurrently-filed U.S. Patent Application, titled "BOND CHUCKS HAVING INDIVIDUALLY-CONTROLLABLE REGIONS, AND ASSOCIATED SYSTEMS AND METHODS." The related application, of which the disclosure is incorporated by reference herein, is assigned to Micron Technology, Inc., and is identified as U.S. application Ser. No. 16/236,449, filed Dec. 29, 2018.

TECHNICAL FIELD

The present patent disclosure generally relates to bond chucks used in the manufacturing of semiconductor devices, and more particularly relates to bond chucks having individually-controllable regions.

BACKGROUND

Semiconductor devices, such as memory chips and microprocessor chips, typically include a semiconductor die bonded to a substrate via a bonding material, such as an adhesive. During conventional bonding processes, the adhesive is disposed on the substrate, and the semiconductor die is moved toward the substrate to be bonded thereto. Often, the adhesive has fluid-like properties and is spun onto a center portion of the substrate. As the semiconductor die moves toward the substrate, the adhesive becomes sandwiched between the substrate and semiconductor die, and is displaced in a lateral direction toward peripheral portions of the substrate. One problem associated with this conventional bonding process is that the distribution of the adhesive to the peripheral portions of the substrate is often limited, and thus the adhesive at the center portions of the substrate tends to be thicker than the adhesive at the peripheral portions of the substrate. As such, thickness of the adhesive can vary significantly across a width of the substrate. More specifically, the above-described conventional bonding process can often result in a cured adhesive film having a total thickness variation (TTV) approximately equal to ten percent of the overall thickness of the adhesive film. As a result, the TTV can increase the vertical footprint of a semiconductor device. Additionally, the TTV can have undesired effects relating to warpage of the semiconductor device.

DETAILED DESCRIPTION

Specific details of several embodiments of the present technology include bond chucks having individually-controllable regions, and associated systems and methods, as described below with reference to the appended Figures. In several of the embodiments, the individually-controllable regions can be configured to move relative to one another, and/or be heated independent of one another. As explained in further detail below, moving the individual regions of the bond chuck and/or heating the individual regions independent of one another can mitigate issues associated with a total thickness variation (TTV) of adhesive films, as well as warpage of the corresponding semiconductor devices. For example, embodiments of the present technology allow improved control for more evenly distributing an adhesive across a width of the substrate, such that TTV of the adhesive is reduced relative to conventional bonding processes.

Figure 1A:
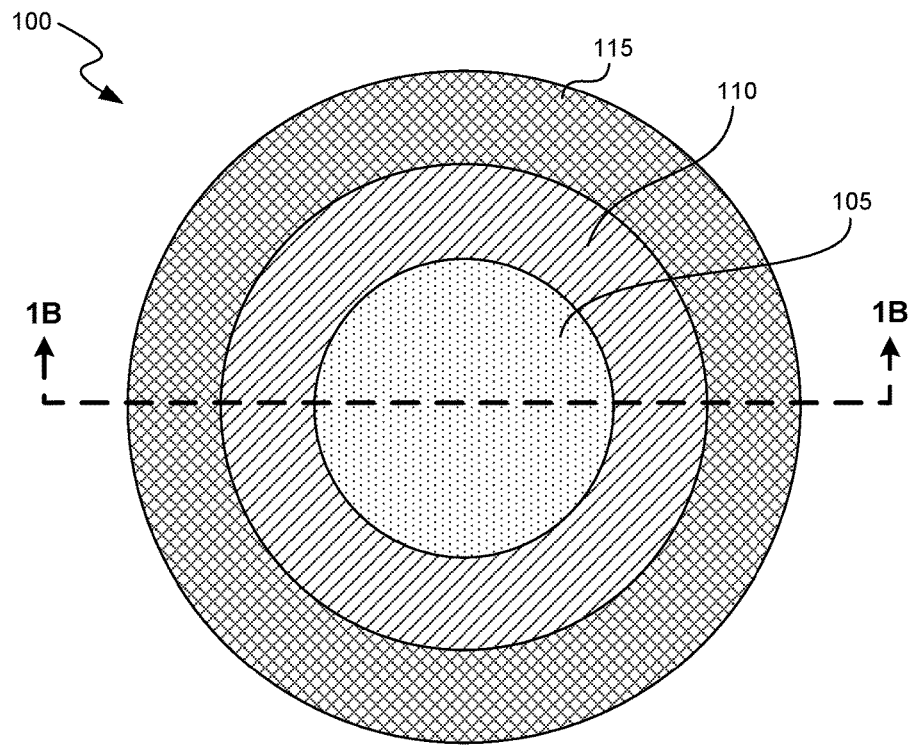
FIG. 1A illustrates a top view of a bond chuck in accordance with embodiments of the present technology.
Figure 1B:
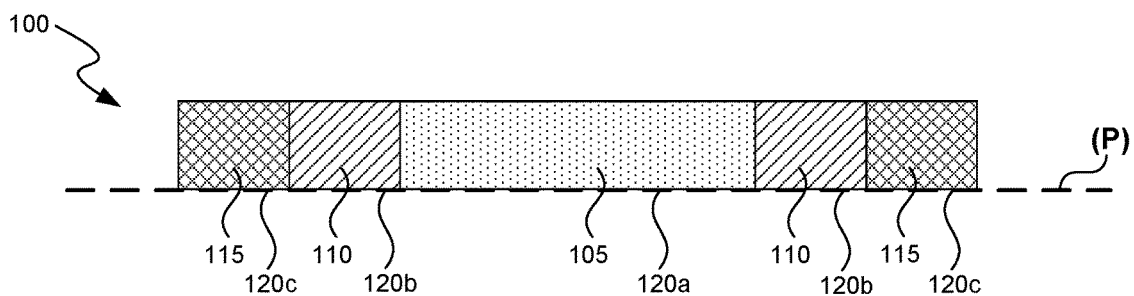
FIG. 1B illustrates a cross-sectional view of the bond chuck shown in FIG. 1A.

FIG. 1A illustrates a top view of a bond chuck 100 in accordance with embodiments of the present technology, and FIG. 1B illustrates a cross-sectional view of the bond chuck 100 shown in FIG. 1A. Referring to FIGS. 1A and 1B together, the bond chuck 100 includes a plurality of individual regions, including a first region 105, a second region 110 peripheral to (e.g., outwardly of) the first region 105, and a third region 115 peripheral to the second region 110. As shown in the illustrated embodiments, the individual regions are radial, with the second region 110 completely surrounding the first region 105, and the third region completely surrounding the first region 105 and the second region 110. In other embodiments (e.g., in non-radial configurations), the second region 110 may only partially surround the first region 105, and the third region 115 may only partially surround the second region 110 and/or the first region 105. Furthermore, while the illustrated embodiments are of a bond chuck 100 having three regions, other embodiments in accordance with the present technology can include less regions (e.g., two regions) or more regions (e.g., four or five regions). The bond chuck 100, including each of the individual first, second and third regions 105, 110, 115, can comprise an electrostatic chuck and be made from a ceramic material or other materials known in the art.

As explained in additional detail below, the individual regions of the bond chuck 100 can be movable relative to one another in a longitudinal direction (e.g., a vertical upward direction and/or a vertical downward direction). The individual regions can be removably or permanently attached to one another such that each individual region is movable relative to one another. In some embodiments, for example, the bond chuck 100 may include a common portion (e.g., an elongated member) extending through each of the individual regions to keep the individual regions coupled to one another even when moved relative to one another. In some embodiments, an individual region may include a slot extending along a portion of a side surface of the particular individual region, and the adjacent region may include a member slidably coupled to the slot. For example, the first region 105 may include a slot along its side surface, and the second region 110 may include a member at its side surface that is slidably attached to the slot of the first region 105. The third region 115 may be slidably attached to the second region 110 in a similar manner. In yet other embodiments, the bond chuck 100 may include a flexible plate positioned adjacent (e.g., over) the individual regions and configured to hold the individual regions in place and also allow movement therebetween. In addition to or in lieu of the foregoing, the individual regions may be attached to one another using friction.

Referring to FIG. 1B, the bond chuck 100 includes a first outer surface 120a over the first region 105, a second outer surface 120b over the second region 110, and a third outer surface 120c over the third region 115 (collectively referred to as the "outer surface 120"). The outer surface 120 is configured to support a wafer or substrate of a semiconductor device. The outer surface 120 extends across and includes portions of the first, second and third regions 105, 110, 115 of the bond chuck 100. As shown in the illustrated embodiment, the outer surface 120 is generally planar along a plane (P).

Figure 1C:
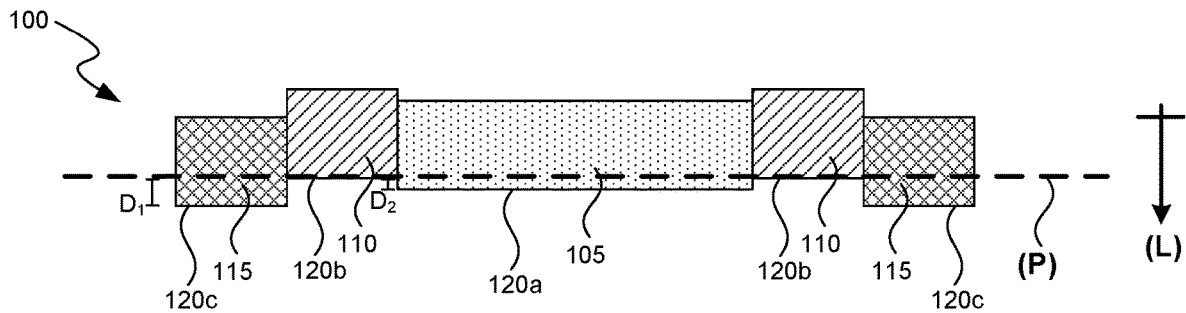
FIG. 1C illustrates a cross-sectional view of the bond chuck shown in FIG. 1B after moving individual regions of the bond chuck.

FIG. 1C illustrates a cross-sectional view of the bond chuck 100 shown in FIG. 1B after individual regions of the bond chuck 100 have been moved. As shown in the illustrated embodiment, the first region 105 has been moved in a longitudinal direction (L) a first distance ($D_1$) from its original position shown in FIG. 1B, and the third region 115 has been moved in the longitudinal direction (L) a second distance ($D_2$) greater than the first distance ($D_1$). The second region 110 has not been moved in the longitudinal direction. As such, the third outer surface 120c extends longitudinally beyond the first outer surface 120a, which extends longitudinally beyond the second outer surface 120b. Accordingly, as shown in the illustrated embodiment, the first, second and third outer surfaces 120a, 120b, 120c are not aligned or planar along the plane (P).

Figure 2:
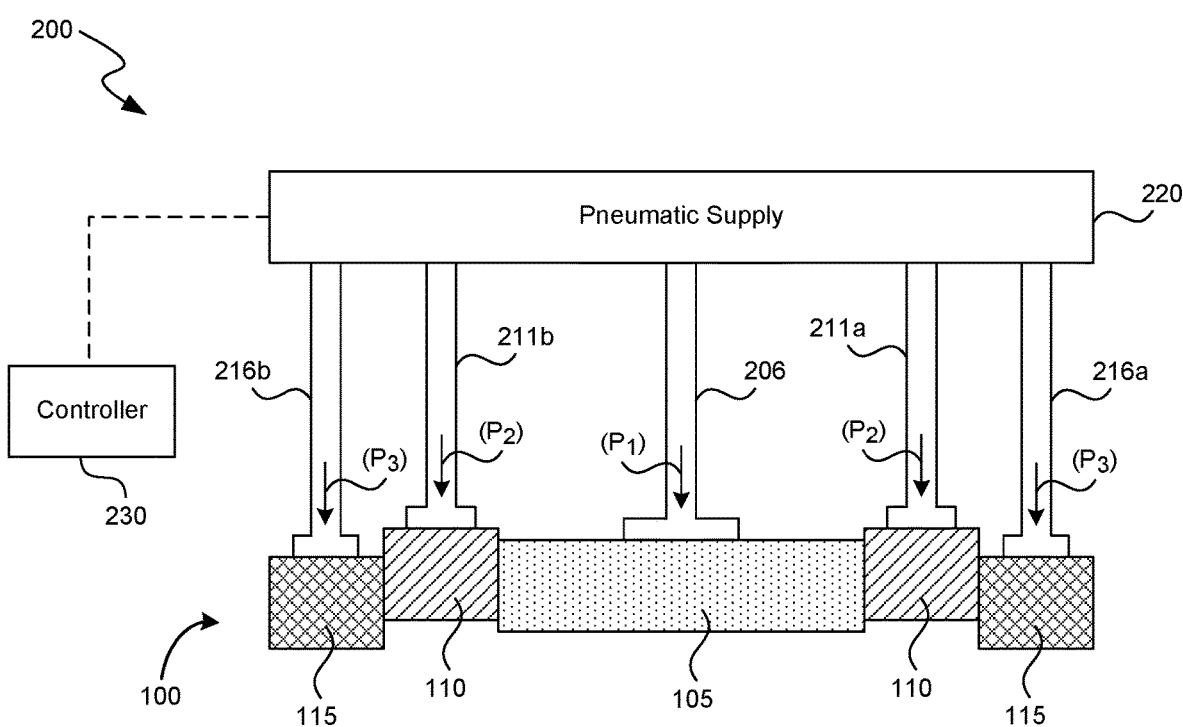
FIG. 2 illustrates a system including a partially-schematic pneumatic supply operably coupled to the bond chuck shown in FIG. 1C, in accordance with embodiments of the present technology.

As previously described, the first, second and third regions 105, 110 and 115 of the bond chuck 100 can be individually movable. Moving the individual regions can be accomplished via multiple means. For example, the individual regions may be moved using electricity (e.g., an electric motor), hydraulics, pneumatics, magnets, or combinations thereof. FIG. 2 illustrates a system 200 including a pneumatic supply 220 operably coupled to the bond chuck 100, in accordance with embodiments of the present technology. As shown in the illustrated embodiment, the system includes (a) the pneumatic supply 220 configured to supply pneumatic fluid (e.g., air), (b) multiple arms operably coupling the pneumatic supply 220 to individual regions of the bond chuck 100, and (c) a controller 230 (e.g., a control system) operably coupled to and configured to control the pneumatic supply 220 and/or movement of the arms. As shown in the illustrated embodiment, the arms include a first arm 206 operably coupled to the first region 105 of the bond chuck 100, second arms 211a, 211b operably coupled to the second region 110 of the bond chuck 100, and third arms 216a, 216b operably coupled to the third region 110 of the bond chuck 100.

The controller 230 may take the form of computer-executable instructions, including routines executed by a programmable computer. The controller 230 may, for example, also include a combination of supervisory control and data acquisition (SCADA) systems, distributed control systems (DCS), programmable logic controllers (PLC), control devices, and processors configured to process computer-executable instructions. Those skilled in the relevant art will appreciate that the technology can be practiced on computer systems other than those described herein. The technology can be embodied in a special-purpose computer or data processor that is specifically programmed, configured or constructed to perform one or more of the computer-executable instructions described herein. Information handled by the controller 230 can be presented at any suitable display medium, including a CRT display or LCD.

The controller 230 can receive one or more inputs (e.g., user inputs and/or calculated inputs) and use the inputs to cause the individual region(s) of the bond chuck 100 to move relative to the other individual region(s). In some embodiments, for example, the controller 230 can cause the pneumatic supply 220 to exert (a) a first pressure ($P_1$) on the first region 105 of the bond chuck 100, (b) a second pressure ($P_2$) on the second region 110 of the bond chuck 100, and (c) a third pressure ($P_3$) on the third region 115 of the bond chuck 100. The first, second and third pressures can all be distinct pressures. In a particular example, upper and lower limits of the first, second and third pressures may vary by more than 5 psi, 10 psi, 20 psi or 30 psi. In embodiments wherein the third pressure ($P_3$) is greater than the first pressure ($P_1$), and the first pressure ($P_1$) is greater than the second pressure ($P_2$), the pneumatic supply will accordingly cause the first region 105 to extend longitudinally beyond the second region 110, and cause the third region 115 to extend longitudinally beyond the first region 105.

In operation, moving the individual regions can affect a shape of a semiconductor device adjacent or proximate (e.g., directly below) the bond chuck. Furthermore, moving the individual regions to different longitudinal positions, relative to one another, can affect the shape of the semiconductor device in a particular manner such that an adhesive of the semiconductor device is displaced in a predetermined or desired direction.

Figure 3A:
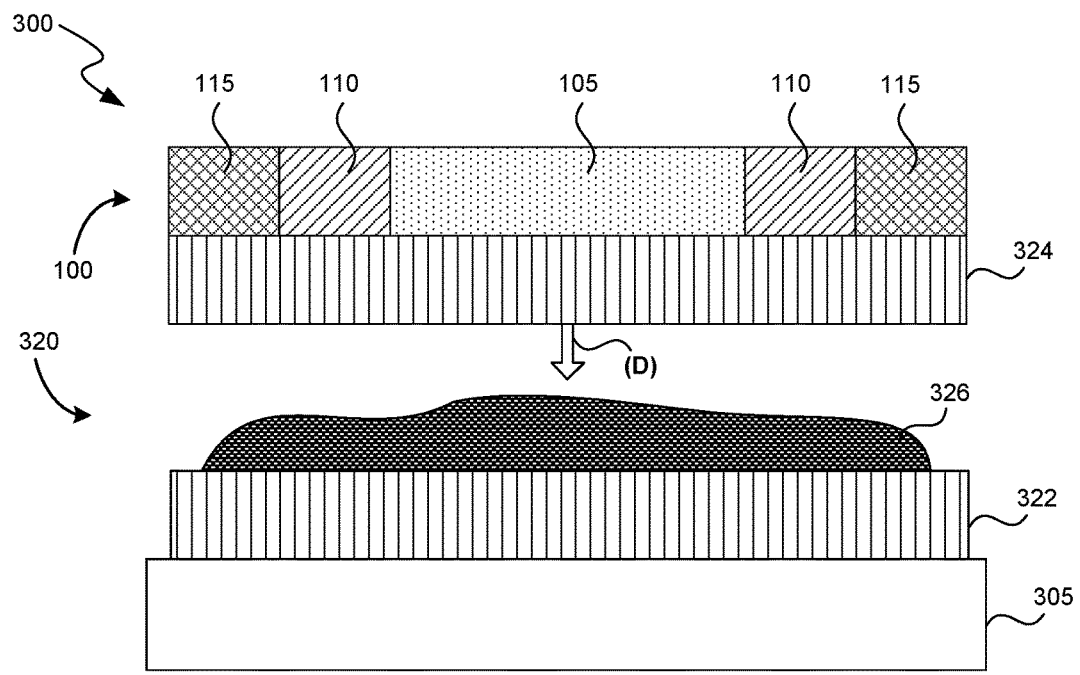
FIGS. 3A-3C illustrate a partially-schematic method of forming a semiconductor device using a bond chuck having individually-controllable regions, in accordance with embodiments of the present technology.
Figure 3B:
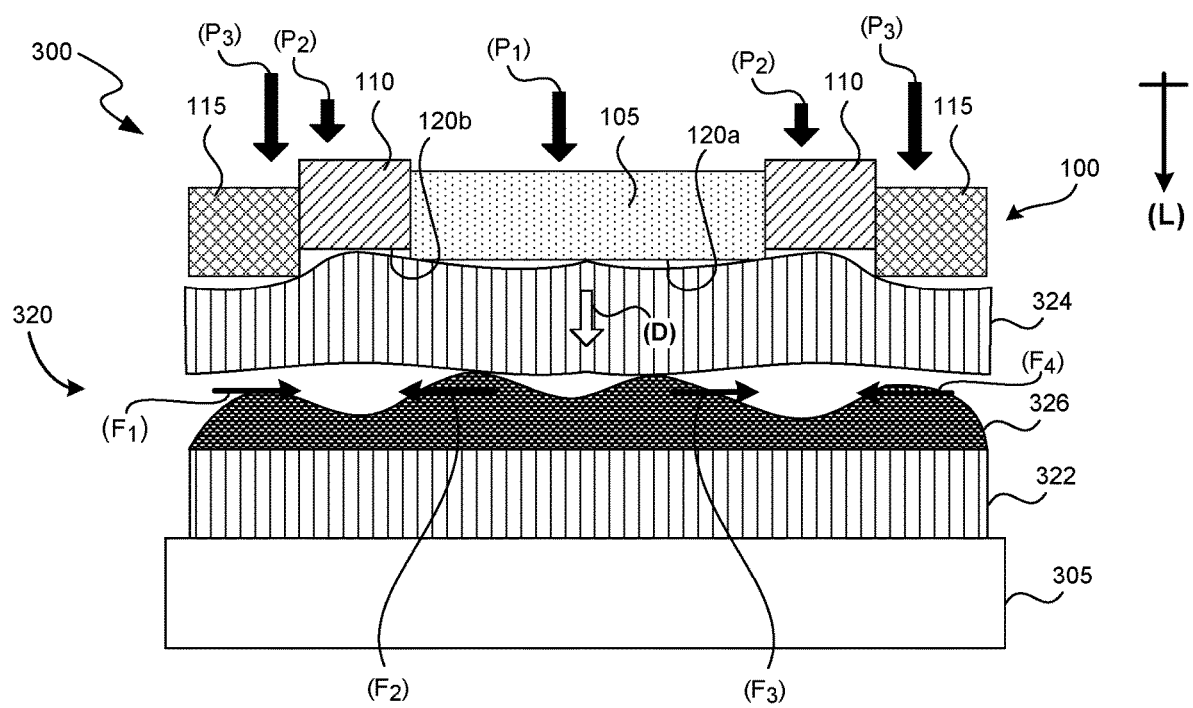
Figure 3C:
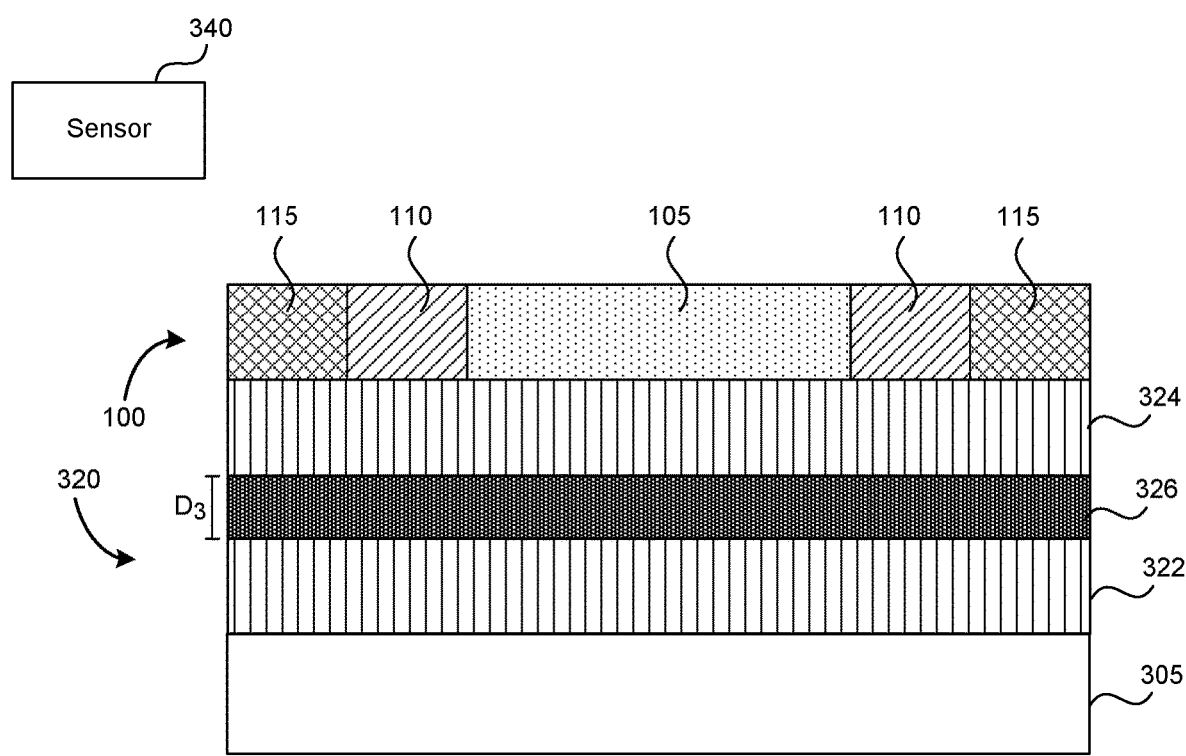

FIGS. 3A-3C illustrate a partially-schematic method 300 of forming a semiconductor device using a bond chuck having individually-controllable regions, in accordance with embodiments of the present technology. Referring first to FIG. 3A, the method 300 includes providing the bond chuck 100 having individually-controllable regions, including the first region 105, the second region 110, and the third region 115, as previously described. The bond chuck 100 is positioned over a semiconductor device 320, and the semiconductor device 320 is positioned over another bond chuck or bond head 305. In some embodiments, the bond head 305 is another bond chuck 100 (e.g., a second bond chuck 100). The semiconductor device 320 includes a first substrate 322 (e.g., a device substrate or a device wafer), a second substrate 324 (e.g., a carrier substrate or a carrier wafer), and an adhesive 326 (e.g., an epoxy) between the first substrate 322 and the second substrate 324. The bond chuck 100 and/or the second substrate 324 are moved in a downward direction (D) such that the first substrate 322 and the second substrate 324 sandwich the adhesive 326, causing it to be displaced in one or more predetermined, lateral direction(s).

The first substrate 322 and the second substrate 324 can each include a die, such as silicon, germanium, silicon-germanium alloy, gallium arsenide, gallium nitride or combinations thereof. In some embodiments, the first substrate 322 and the second substrate 324 are each semiconductor wafers. In other embodiments, the first substrate 322 and the second substrate 324 may each be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

Referring next to FIG. 3B, individual regions of the bond chuck 100 are moved in the longitudinal direction (L) toward the semiconductor device 320. As shown in the illustrated embodiment, the individual regions are moved to a particular position by exerting a pressure thereon. For example, the first pressure ($P_1$) is exerted on the first region 105, the second pressure ($P_2$) is exerted on the second region 110, and the third pressure ($P_3$) is exerted on the third region 115. As a result, the first region 105 is moved to a first position longitudinally beyond a second position of the second region 110, and the third region 115 is moved to a third position longitudinally beyond the first position of the first region 105. The first, second and third positions of the first, second and third regions 105, 110, 115, respectively, affect the shape of the second substrate 324 and thereby cause the second substrate 324 to force the adhesive in a particular direction. As shown in the illustrated embodiment, (a) a first portion of the adhesive 326 below the third region 115 is forced inwardly in a first lateral direction ($F_1$) toward a first area below the second region 110, (b) a second portion of the adhesive 326 below the first region 105 is forced outwardly in a second lateral direction ($F_2$) toward the first area below the second region 110, (c) a third portion of the adhesive 326 below the first region 105 is forced outwardly in a third lateral direction ($F_3$), generally opposite the second lateral direction ($F_2$), toward a second area below the second region 110, and (d) a fourth portion of the adhesive 326 below the third region 115 is forced inwardly in a fourth lateral direction ($F_4$) toward the second area below the second region 110. In doing so, the adhesive is intentionally and controllably displaced a predetermined manner.

One advantage of embodiments of the present technology is that the individually-controllable regions can be used to decrease a total thickness variation (TTV) of the adhesive, which thereby decreases an overall thickness of the semiconductor device 320. As previously described, a disadvantage or common issue associated with conventional methods of forming semiconductor devices is that adhesives are not evenly distributed across a width of the substrate that the adhesive is disposed on, and as a result the TTV of the adhesive can be significant. This is at least in part due to the manner in which two substrates are bonded to one another using a liquid adhesive. For example, using conventional bonding methods, the liquid adhesive is often disposed in a center portion of a lower substrate, and the bond chuck supporting the lower substrate is spun, thereby forcing the adhesive outwardly toward the periphery of the lower substrate via centrifugal force. As the bond chuck spins the lower substrate, an upper substrate to be bonded to the lower substrate is brought in contact with the adhesive and also forces it outwardly toward the periphery of the lower substrate. Despite these forces, an even distribution of the adhesive across the width of the lower substrate is often not achieved. As a result, the center portion over the lower substrate tends to contain the thickest portion of the adhesive, and the outer portions of the lower substrate tend to contain the thinnest portion. Furthermore, minor deformities in the surfaces of the lower and upper substrates in contact with the adhesive can cause additional thickness variations.

Embodiments of the present technology mitigate these issues by moving the individual regions of the bond chuck 100 to affect a shape of the substrate that more effectively forces the adhesive in predetermined directions to decrease TTV of the adhesive. For example, in the embodiment illustrated in FIG. 3B, the first outer surface 120a of the first region 105 is longitudinally beyond (i.e., lower than) the second outer surface 120b of the second region 110. Accordingly, compared to traditional bond chucks which have a planar surface, the protruding first outer surface 120a of the first region 105 of the present technology more effectively displaces the adhesive below the first region 105 and forces the adhesive outwardly, e.g., in the second lateral direction ($F_2$) and the third lateral direction ($F_3$). In doing so, the TTV of the adhesive is decreased. It is expected that some embodiments of the present technology can reduce TTV to be approximately less than 5%, 4%, 3%, 2%, or 1% of the total thickness of the adhesive. For example, for a cured adhesive film having a thickness of 100 microns, utilizing embodiments of the present technology can result in the TTV for that adhesive being less than 5 microns.

FIG. 3C illustrates the semiconductor device 320 after the adhesive 326 has been at least partially distributed between the first and second substrates 322, 324. In some embodiments, the thickness ($D_3$) of the adhesive can be measured via a sensor 340. Based on the measured thickness, the first, second and/or third regions 105, 110, 115 may be individually moved relative to one another to displace the adhesive 326 in a particular direction. For example, if the thickness of an outer portion of the adhesive 326 (e.g., under the third region 115) is above a predetermined threshold or target, the third region 115 may be longitudinally moved toward the adhesive 326, and/or the second region 110 may be longitudinally moved away from the adhesive 326, to displace and cause the adhesive 326 to laterally flow toward a center area below the first region 105. Once the desired thickness and/or TTV of the adhesive 326 is achieved, the adhesive 326 may thereafter be cured.

Figure 4A:
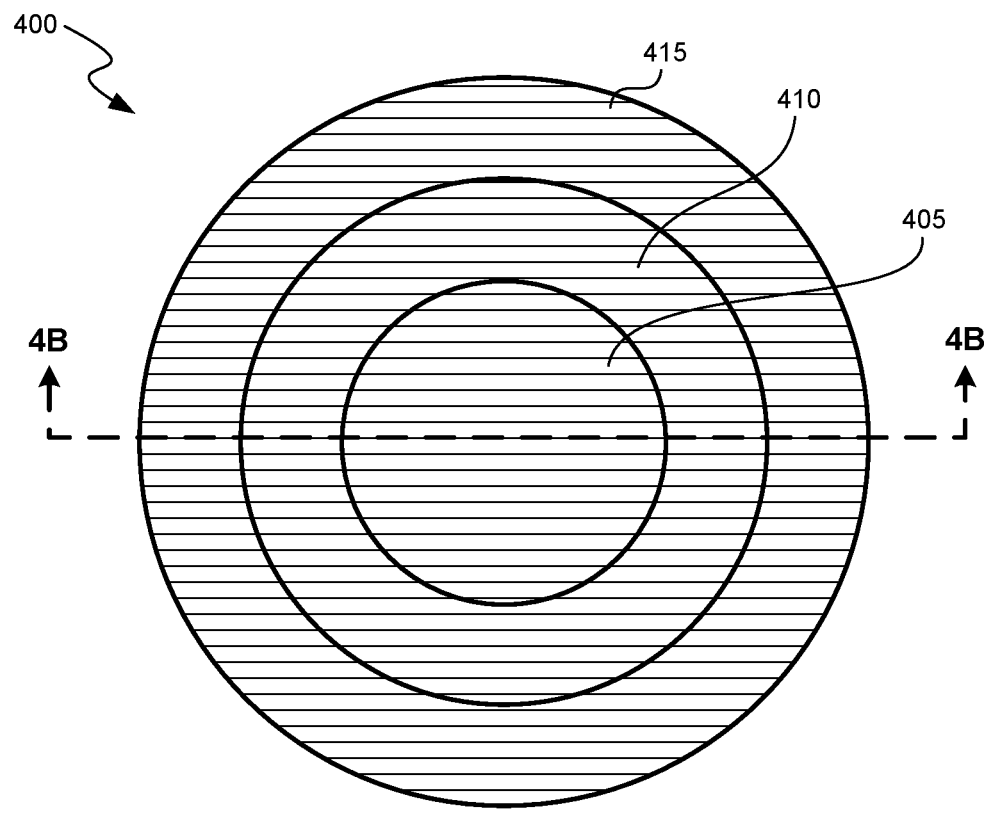
FIG. 4A illustrates a top view of a bond chuck in accordance with embodiments of the present technology.
Figure 4B:
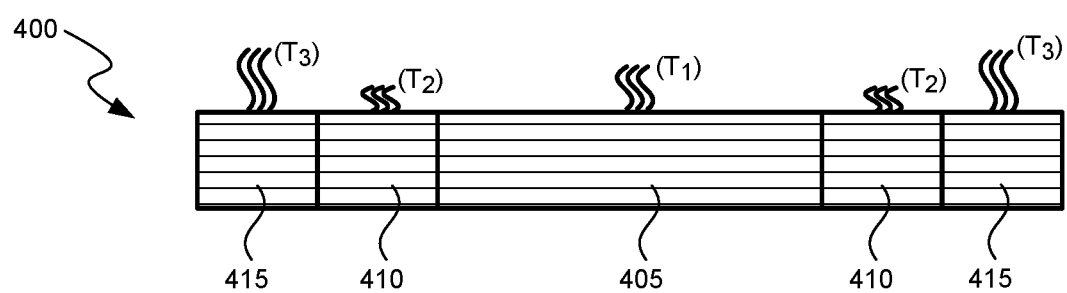
FIG. 4B illustrates a cross-sectional view of the bond chuck shown in FIG. 4A.

As previously described, several embodiments of the present technology include bond chucks having individually-controllable regions. FIGS. 4A-6C generally illustrate bond chucks having individual regions that can be individually heated independent of one another. FIG. 4A, for example, illustrates a top view of a bond chuck 400 in accordance with embodiments of the present technology, and FIG. 4B illustrates a cross-sectional view of the bond chuck 400 shown in FIG. 4A. Referring to FIGS. 4A and 4B together, the bond chuck 400 includes a plurality of individual regions, including a first region 405, a second region 410 peripheral to (e.g., outwardly of) the first region 405, and a third region 415 peripheral to the second region 410. As shown in the illustrated embodiments, the bond chuck 400 is radial, and the second region 410 completely surrounds the first region 405, and the third region completely surround the first region 405 and the second region 410. In other embodiments (e.g., in non-radial configurations), the second region 410 may only partially surround the first region 405, and the third region 415 may only partially surround the second region 410 and/or the first region 405. Furthermore, while the illustrated embodiments are of a bond chuck 400 having three regions, other embodiments in accordance with embodiments of the present technology can include less regions (e.g., two regions) or more regions (e.g., four or five regions). The bond chuck 400, including each of the individual first, second and third regions 405, 410, 415, can comprise an electrostatic chuck and be made from a ceramic material or other materials known in the art.

As explained in additional detail below, the individual regions of the bond chuck 400 can be heated independent of one another. For example, in some embodiments the first region 405 is configured to be heated to a first temperature ($T_1$) within a first temperature range, the second region 410 is configured to be heated to a second temperature ($T_2$) within a second temperature range, and the third region 415 is configured to be heated to a third temperature ($T_3$) within a third temperature range. The first, second and third temperatures ($T_1$), ($T_2$), ($T_3$) can all be distinct temperatures. The first, second and third temperature ranges may be different or the same. In a particular example, upper and lower limits of the first, second and third temperatures ($T_1$), ($T_2$), ($T_3$) may vary by more than 10° F., 20° F. or 30° F.

Figure 5A:
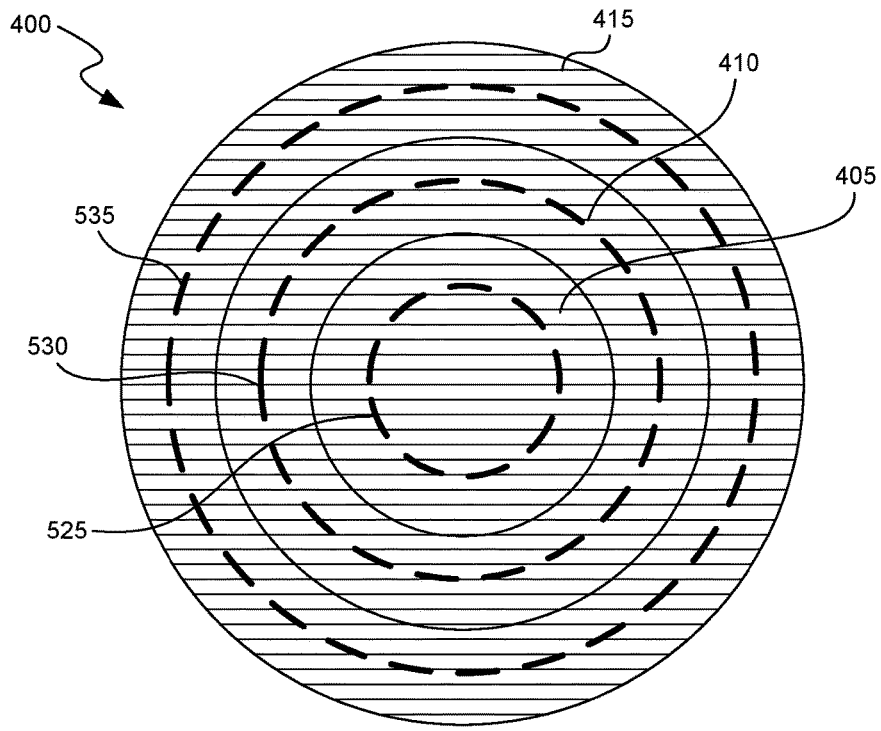
FIG. 5A illustrates a partially-schematic top view of a bond chuck including coils, in accordance with embodiments of the present technology.
Figure 5B:
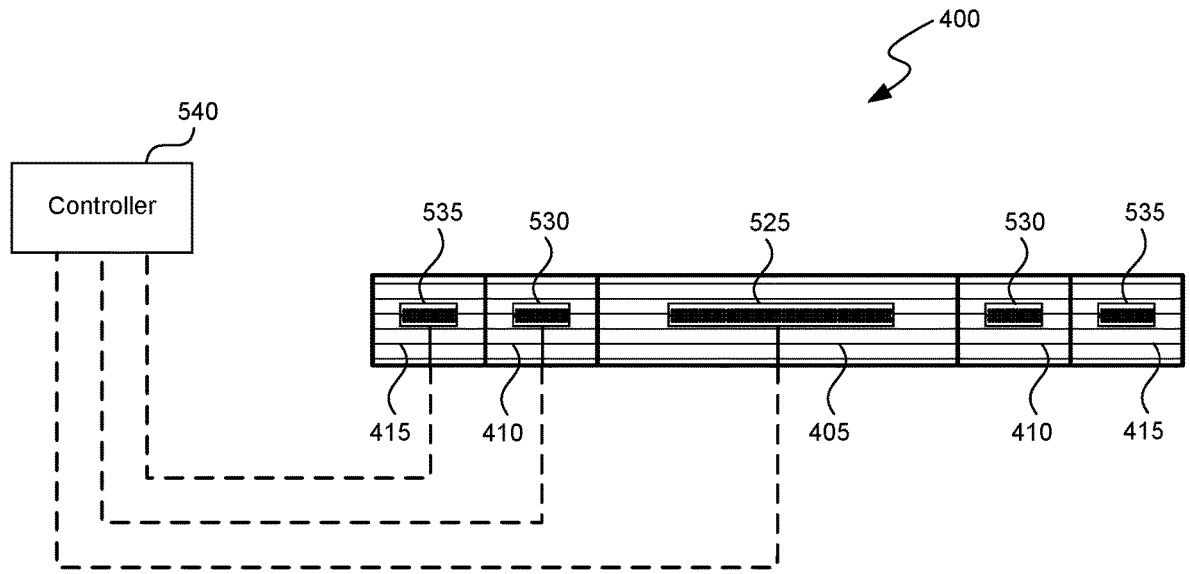
FIG. 5B illustrates a cross-sectional view of the bond chuck shown in FIG. 5A.

The individual regions of the bond chuck 400 can be heated via multiple means. For example, the individual regions may be heated using convection (e.g., a heating fluid) heating or electricity (e.g., coils). FIG. 5A illustrates a partially-schematic top view of the bond chuck 400 including coils for heating individual regions of the bond chuck 400, and FIG. 5B illustrates a cross-sectional view of the bond chuck 400 shown in FIG. 5A. Referring to FIGS. 5A and 5B together, the bond chuck 400 includes (a) a first coil 525 configured to heat the first region 405 to the first temperature, (b) a second coil 530 configured to heat the second region 410 to the second temperature, and (c) a third coil 535 configured to heat the third region 415 to the third temperature. As shown in the illustrated embodiment, the first, second and third coils 525, 530, 535 are each embedded within the first, second and third regions 405, 410, 415, respectively, such that no surfaces of the first, second and third coils 525, 530, 535 are exposed through the bond chuck 400. In other embodiments, the first, second and/or third coils 525, 530, 535 can be arranged at the first, second and third regions 405, 410, 415, respectively, such that the first, second and/or third coils 525, 530, 535 are at least partially exposed through the bond chuck 400. In some embodiments, the bond chuck 400 can include an air gap or insulating material between the first, second and third regions 405, 410, 415 and/or the first, second and third coils 525, 530, 535. The air gap can help prevent heat dissipation from individual regions to neighboring individual regions. In addition to or in lieu of the foregoing, the bond chuck 400 can include a conductive material (e.g., Teflon) between the first, second and third regions 405, 410, 415 and/or the first, second and third coils 525, 530, 535. The conductive material can help promote heat dissipation from individual regions to neighboring individual regions.

Referring to FIG. 5B, a controller 540 can be operably coupled to the first, second and/or third coils 525, 530, 535 to control the temperature to which the first, second and third regions 405, 410, 415, respectively, are heated. The controller 540 can individually heat the first, second and third coils 525, 530, 535 independent of one another. Accordingly, the electrical pathway between the controller 540 and the first coil 525 can be a first circuit, the electrical pathway between the controller 540 and the second coil 525 can be a second circuit different than the first circuit, and the electrical pathway between the controller 540 and the third coil 535 can be a third circuit different than the first and second circuits. The controller 540 may be generally similar to the controller 230 previously described with reference to FIG. 2, in that the controller 540 may take the form of computer-executable instructions, including routines executed by a programmable computer. The controller 540 may, for example, also include a combination of supervisory control and data acquisition (SCADA) systems, distributed control systems (DCS), programmable logic controllers (PLC), control devices, and processors configured to process computer-executable instructions. Those skilled in the relevant art will appreciate that the technology can be practiced on any known computer systems, and can be embodied in a special-purpose computer or data processor that is specifically programmed, configured or constructed to perform one or more of the computer-executable instructions described below. Information handled by the controller 540 can be presented at any suitable display medium, including a CRT display or LCD.

Figure 6A:
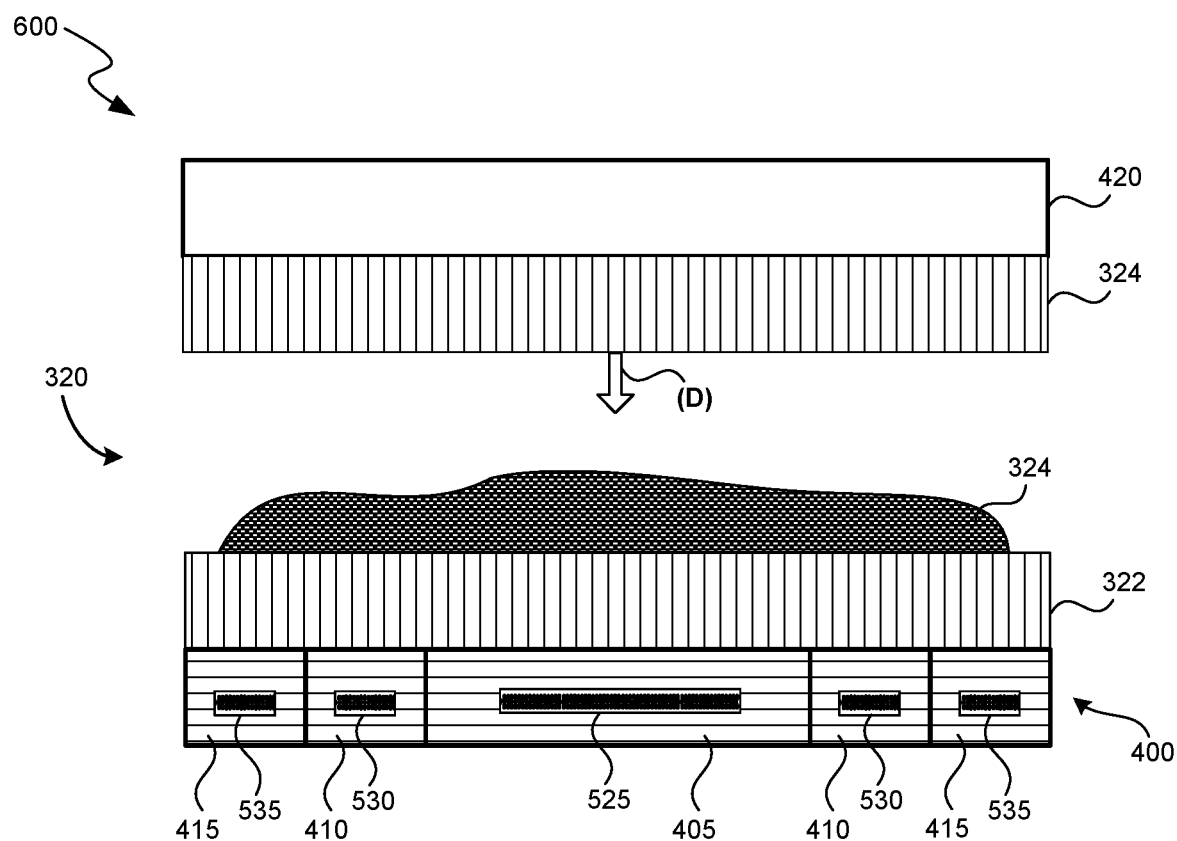
FIGS. 6A-6C illustrate a partially-schematic method of forming a semiconductor device using a bond chuck having individually-controllable regions, in accordance with embodiments of the present technology.
Figure 6B:
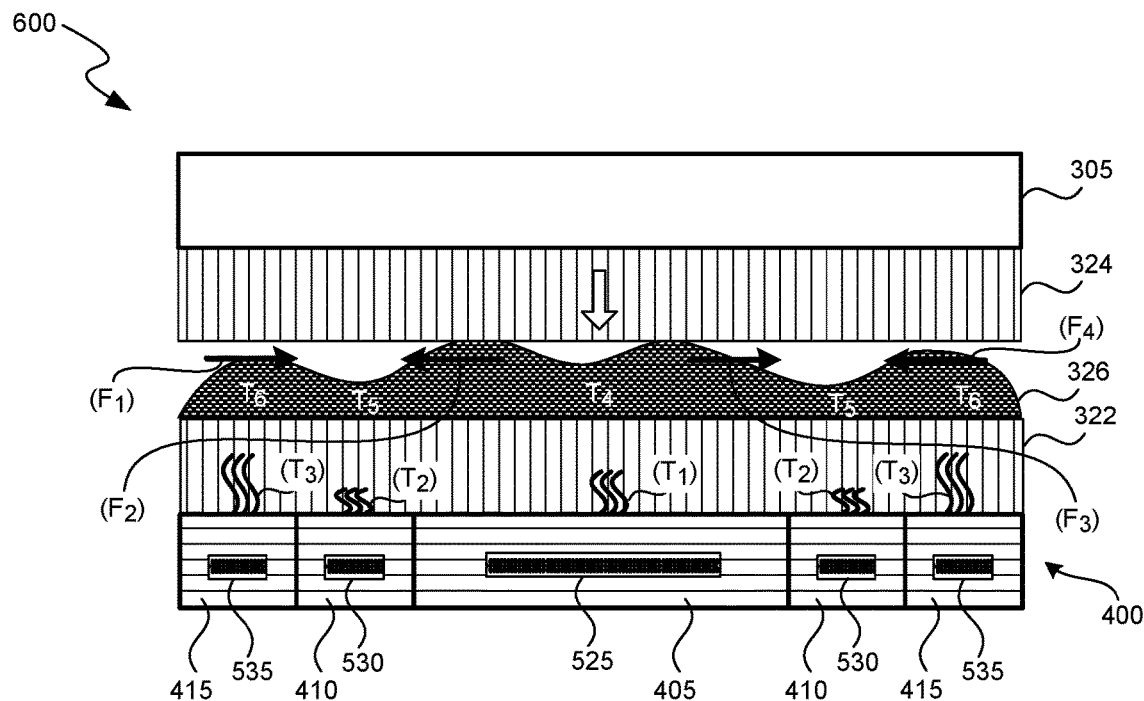
Figure 6C:
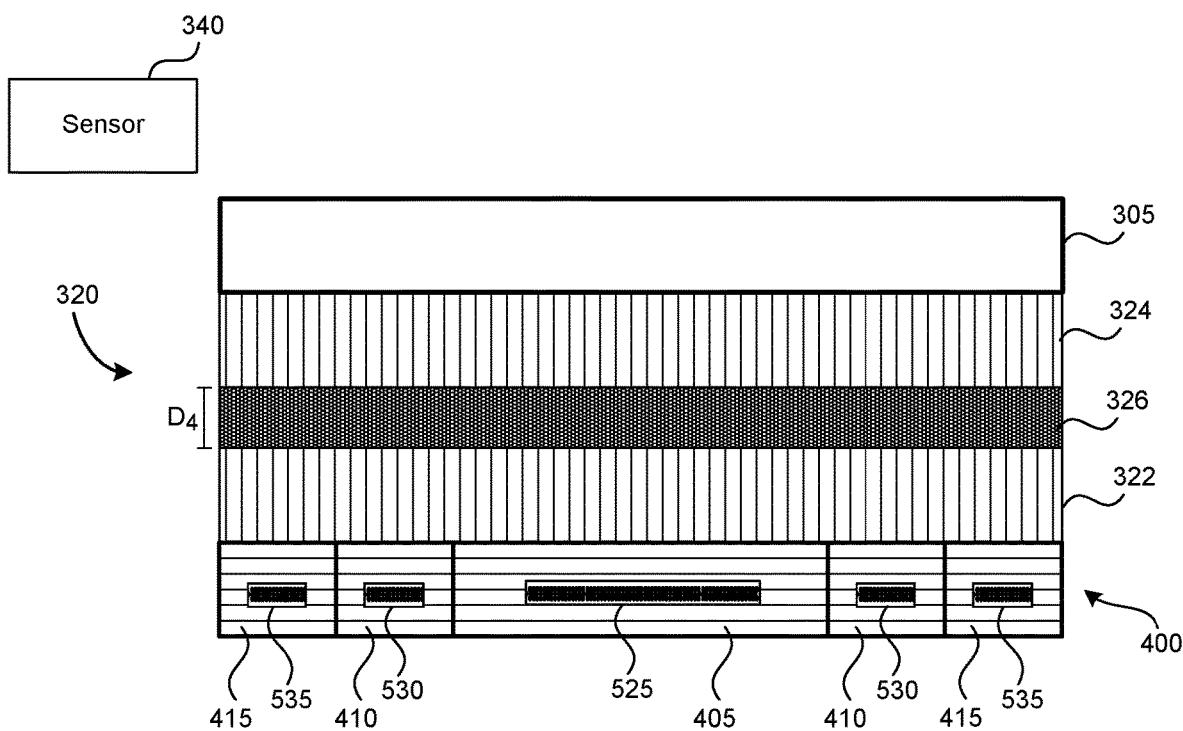

FIGS. 6A-6C illustrate a partially-schematic method 600 of forming a semiconductor device using the bond chuck 400 having individually-controllable regions, in accordance with embodiments of the present technology. Referring first to FIG. 6A, the method 600 includes providing the bond chuck 400 having individually-controllable regions, including the first region 405, the second region 410, and the third region 415, as previously described. The bond chuck 400 is positioned adjacent (e.g., below) the semiconductor device 320 previously described with reference to FIGS. 3A-3C. Another bond chuck or bond head 305, as previously described with reference to FIGS. 3A-3C, is positioned over the semiconductor device 320. In some embodiments, the bond head 305 can be the bond chuck 400 (e.g., a second bond chuck 400). The semiconductor device 320 includes the first substrate 322 (e.g., a device substrate or a device wafer), the second substrate 324 (e.g., a carrier substrate or a carrier wafer), and the adhesive or epoxy 326 between the first substrate 322 and the second substrate 324. The bond chuck 100 and/or the second substrate 324 are moved in a downward direction (D) such that the first substrate 322 and the second substrate 324 sandwich the adhesive 326, causing it to be displaced in one or more predetermined direction(s).

Referring next to FIG. 6B, the individual regions of the bond chuck 400 are heated independent of one another, e.g., via the controller 540 (FIG. 5B). For example, the first region 405 is heated to the first temperature ($T_1$) via the first coil 525, the second region 410 is heated to the second temperature ($T_2$), less than the first temperature ($T_1$), via the second coil 530, and the third region 415 is heated to the third temperature ($T_3$), greater than the first temperature ($T_1$), via the third coil 535. The first, second and third temperatures ($T_1$), ($T_2$), ($T_3$) heat the corresponding regions of the first substrate 322, which heats the corresponding regions of the adhesive 326. As shown in the illustrated embodiment, heating the first region 405 to the first temperature ($T_1$) causes the corresponding region of the adhesive 326 to be heated to a fourth temperature ($T_4$) slightly less than the first temperature ($T_1$), heating the second region 410 to the second temperature ($T_2$) causes the corresponding region of the adhesive 326 to be heated to a fifth temperature ($T_5$) slightly less than the second temperature ($T_2$), and heating the third region 415 to the third temperature ($T_3$) causes the corresponding region of the adhesive 326 to be heated to a sixth temperature ($T_6$) slightly less than the third temperature ($T_3$). The temperature of the adhesive 326 affects the viscosity of the adhesive 326, with a higher temperature corresponding to a lower viscosity. Furthermore, the viscosity affects the flowability of the adhesive 326, with a higher viscosity corresponding to less flowability. As such, if the fourth temperature ($T_4$) is greater than the fifth temperature ($T_5$) and less than the sixth temperature ($T_6$), the viscosity of the adhesive 326 varies across a width of the first substrate 322. Furthermore, the flowability also varies across the width of the first substrate 322, with the flowability being highest over the third region 415 and lowest over the second region 410.

The individual regions of the bond chuck 400 can be heated to cause the adhesive to flow in a particular, predetermined direction. For example, depending on the adhesive, thickness of the overall semiconductor device 320, and/or adhesive disposition process, the individual regions can be individually heated to form the semiconductor device 320 having a minimal TTV. In some embodiments, the individual regions may be heated based on a profile of the semiconductor device 320 being formed, with the profile being based on data for previous devices using at least one of the same first substrate 322, second substrate 324 or adhesive 326.

As shown in the illustrated embodiment, the portion of the adhesive corresponding to the fourth temperature ($T_4$) has a lower viscosity than the portion of the adhesive corresponding to the fifth temperature ($T_5$). Accordingly, the portion of the adhesive over the first region 405 and corresponding to the fourth temperature ($T_4$) would therefore be urged outward in the second lateral direction ($F_2$) and third lateral direction ($F_3$) toward the portion of the adhesive over the second region 410 and corresponding to the fifth temperature ($T_5$). As also shown in the illustrated embodiment, the portion of the adhesive corresponding to the sixth temperature ($T_6$) has a lower viscosity than the portion of the adhesive corresponding to the fifth temperature ($T_5$). Accordingly, the portion of the adhesive over the third region 415 and corresponding to the sixth temperature ($T_6$) would therefore be urged inward in the first lateral direction ($F_1$) and fourth lateral direction ($F_4$) toward the portion of the adhesive over the second region 410 and corresponding to the fifth temperature ($T_5$).

As previously mentioned, an advantage of embodiments of the present technology is that the individually-controllable regions can be used to decrease a total thickness variation (TTV) of the adhesive, which decreases an overall thickness of the semiconductor device 320. Heating the individual regions of the bond chuck 400 affects the flowability of the adhesive, and can be used to more effectively force the adhesive to flow in a predetermined direction, relative to conventional processes previously described. For example, if an outer portion of the adhesive 326 (e.g., over the third region 415) has a thickness above a predetermined threshold or target, the third region 415 may be heated to a temperature sufficient to cause the adhesive 326 over the third region 415 to laterally flow toward a center area below the first region 405. Once the desired TTV of the adhesive is achieved, the adhesive 326 can be cured.

Another advantage of some embodiments of the present technology is that warpage of the semiconductor device 320 can be mitigated and/or more effectively controlled. In conventional methods of forming semiconductor devices, the bond chucks are uniformly heated to a single temperature, and thus the adhesive is cured at the single temperature. If the adhesive includes portions that are thicker than others, the semiconductor device will experience warpage. Embodiments of the present technology mitigate this issue because the temperature of individual regions of the bond chuck 400 can be individually controlled, thus allowing the adhesive to more evenly distribute across a width of the substrate. Accordingly, the thicker portions of adhesive formed when using the conventional methods are avoided, and warpage of the semiconductor device is mitigated. Furthermore, warpage is further mitigated by embodiments of the present technology in that the individual regions heated to different temperatures allow the adhesive adjacent the individual regions to be cured at different rates.

FIG. 6C illustrates the semiconductor device 320 after the adhesive 326 has been at least partially distributed between the first and second substrates 322, 324. In some embodiments, the thickness ($D_4$) of the adhesive can be measured via the sensor 340 previously described with reference to FIG. 3C. Based on the measured thickness ($D_4$), the first, second and/or third regions 405, 410, 420 may be individually heated to cause the adhesive to flow in a particular direction based on its viscosity.

Figure 7:
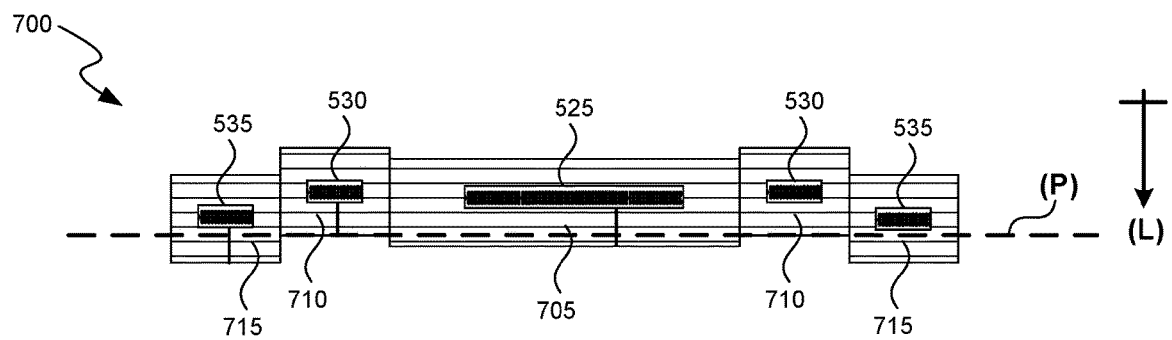
FIG. 7 illustrates a cross-sectional view of a bond chuck including individually-movable regions and coils for heating the individually-movable regions.

FIG. 7A illustrates a partially-schematic cross-sectional view of a bond chuck 700 including individually-movable regions and coils for heating the individually-movable regions. As shown in the illustrated embodiment, the bond chuck 700 includes a first region 705 having the first coil 525, a second region 710 at least partially peripheral to the first region 705 and having the second coil 530, and a third region 715 at least partially peripheral to the second region 710 and having the third coil 535. The first region 705 extends beyond the plane (P) in a longitudinal direction (L) to a first position, the second region 710 extends to the plane (P) to a second position, and the third region 715 extends in the longitudinal direction (L) beyond the plane (P) and the first region 705 to a third position. The individual regions of the bond chuck 700 can be individually heated and moved relative to one another. Accordingly, the bond chuck 700 can be used to affect an adhesive fluid and decrease TTV thereof, as previously described.

Figure 8:
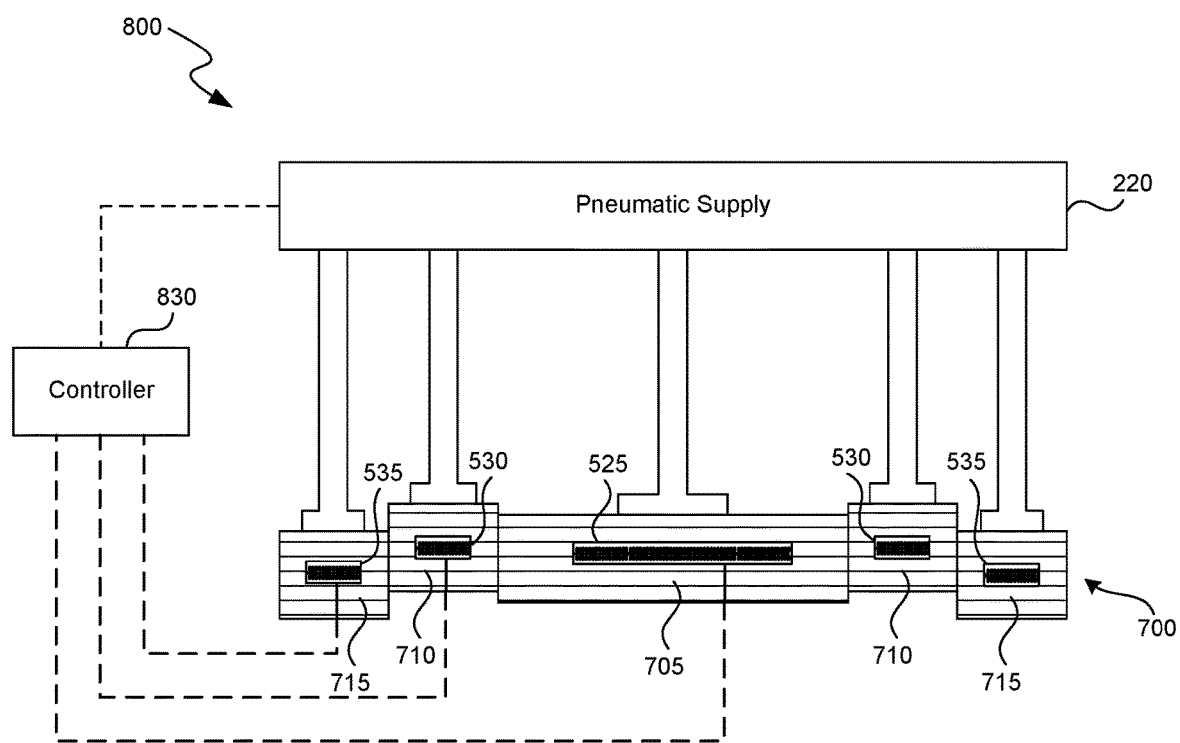
FIG. 8 illustrates a system for operating the bond chuck shown in FIG. 7.

FIG. 8 illustrates a system 800 including the bond chuck 700. As shown in the illustrated embodiment, the system includes the pneumatic supply 220 for controlling movement of individual regions of the bond chuck 700, and a controller 830 be operably coupled to the pneumatic supply 220 and the first, second and third coils 525, 530, 535. The controller 830 can include features generally similar to those previously described for the controller 230 (FIG. 2) and the controller 540 (FIG. 5B). Accordingly, the controller 830 is configured to control movement and heating of the individual regions of the bond chuck 700. In operation, the system 800 is configured to control the relatively even distribution of adhesive for forming semiconductor devices with improved TTV.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

As used herein, the terms "vertical," "horizontal," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

From the foregoing, it will be appreciated that specific embodiments of the invention have been described herein for purposes of illustration, but that various modifications may be made without deviating from the scope of the invention. For example, Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

We claim:

1. A system for manufacturing semiconductor devices, comprising:
    a chuck having a plurality of regions including a first region, and a second region peripheral to the first region; and
    a controller having instructions that, when executed, cause (a) the first region to be heated to a first temperature, and (b) the second region to be heated to a second temperature different than the first temperature.

2. The system of claim 1 wherein the chuck further comprises (a) a first coil disposed within the first region and configured to heat the first region to the first temperature, and (b) a second coil disposed within the second region and configured to heat the second region to the second temperature, and wherein the controller is in electrical communication with the first coil and the second coil.

3. The system of claim 2, further comprising a first circuit associated with the first coil and a second circuit associated with the second coil, wherein the controller is in electrical communication with the first coil via the first circuit and the second coil via the second circuit.

4. The system of claim 2 wherein:
    the plurality of regions further comprises a third region peripheral to the second region, and
    the chuck further comprises a third coil disposed within the third region and configured to heat the third region to a third temperature different than the first temperature and the second temperature.

5. The system of claim 1 wherein the plurality of regions further comprises a third region peripheral to the second region, wherein the instructions, when executed, cause the third region to be heated to a third temperature different than the first temperature and the second temperature.

6. The system of claim 1 wherein the first temperature and the second temperature are within a temperature range of from about 5° F. to 20° F.

7. The system of claim 1 wherein at least one of the first region or the second region is movable relative to the other in a longitudinal direction.

8. A tool for use in manufacturing semiconductor devices, comprising:
    a first region;
    a first coil disposed within the first region and configured to heat the first region to a first temperature;
    a second region adjacent the first region; and
    a second coil disposed within the second region and configured to heat the second region to a second temperature different than the first temperature.

9. The tool of claim 8 wherein the tool includes an outer continuous surface that includes the first region and the second region.

10. The tool of claim 8 wherein the second region is peripheral to and entirely surrounds the first region.

11. The tool of claim 8, further comprising:
    a third region adjacent the second region; and
    a third coil disposed within the third region and configured to heat the third region to a third temperature different than at least one of the first temperature or the second temperature.

12. The tool of claim 11 wherein the third region is peripheral to and entirely surrounds the second region.

13. A method for bonding semiconductor devices, comprising:
    providing a chuck having multiple regions including a first region and a second region at least partially surrounding the first region;
    heating the first region to a first temperature; and
    heating the second region to a second temperature different than the first temperature.

14. The method of claim 13 wherein:
    the chuck includes (a) a first coil disposed at least partially within the first region and comprising a first circuit, and (b) a second coil disposed at least partially within the second region and comprising a second circuit,
    heating the first region includes heating the first coil to the first temperature, and
    heating the second region includes heating the second coil to the second temperature.

15. The method of claim 14 wherein heating the first region and heating the second region are done via a controller, the controller being in electrical communication with the first coil via the first circuit and with the second coil via the second circuit.

16. The method of claim 13 wherein the multiple regions include a third region at least partially surrounding the second region, the method further comprising heating the third region to a third temperature different than at least one of the first temperature or the second temperature.

17. The method of claim 13, further comprising:
    positioning the chuck over a semiconductor device comprising a first substrate, a second substrate, and an adhesive between the first substrate and the second substrate;
    wherein—
        the first region is over a first area of the first substrate and the second region is over a second area of the first substrate, heating the first region of the chuck includes heating a first portion of the adhesive, via the first area, to a third temperature associated with the first temperature, and heating the second region of the chuck includes heating a second portion of the adhesive, via the second area, to a fourth temperature associated with the second temperature.

18. The method of claim 17, further comprising:

curing the first portion of the adhesive at a first rate; and curing the second portion of the adhesive at a second rate different than the first rate.

19. The method of claim 17, further comprising:

after heating the first region and the second region, measuring a thickness of the adhesive between the first substrate and the second substrate, and heating at least one of the first region or the second region based on the measured thickness.

20. The method of claim 17 wherein heating the first region and heating the second region is done via a controller, the method further comprising:

inputting to the controller one or more parameter(s), wherein the parameters are based at least in part on characteristics of at least one of the first substrate, the adhesive, or the second substrate, wherein heating the first region is based on the inputted one or more parameter(s).

* * * * *